US 11,557,707 B2

(12) United States Patent
Uchiyama (10) Patent No.: US 11,557,707 B2
(45) Date of Patent: Jan. 17, 2023

(54) THERMOELECTRIC POWER-GENERATION DEVICE

(71) Applicant: ATSUMITEC CO., LTD., Shizuoka (JP)

(72) Inventor: Naoki Uchiyama, Shizuoka (JP)

(73) Assignee: ATSUMITEC CO., LTD., Shizuoka (JP)

( * ) Notice: Subject to any disclaimer, the term of this patent is extended or adjusted under 35 U.S.C. 154(b) by 0 days.

(21) Appl. No.: 16/961,531

(22) PCT Filed: Feb. 21, 2019

(86) PCT No.: PCT/JP2019/006541
§ 371 (c)(1),
(2) Date: Jul. 10, 2020

(87) PCT Pub. No.: WO2019/176495
PCT Pub. Date: Sep. 19, 2019

(65) Prior Publication Data
US 2021/0057627 A1    Feb. 25, 2021

(30) Foreign Application Priority Data

Mar. 16, 2018  (JP) .............................. JP2018-049649

(51) Int. Cl.
*H01L 35/30* (2006.01)
*H01L 35/32* (2006.01)

(52) U.S. Cl.
CPC .............. *H01L 35/30* (2013.01); *H01L 35/32* (2013.01)

(58) Field of Classification Search
None
See application file for complete search history.

(56) References Cited

U.S. PATENT DOCUMENTS

| 5,006,178 A | 4/1991 | Bijvoets |
| 6,121,539 A * | 9/2000 | Johnson ................. H01L 23/38 |
| | | 136/203 |

(Continued)

FOREIGN PATENT DOCUMENTS

| JP | H0249480 A | 2/1990 |
| JP | 2000-009361 A | 1/2000 |

(Continued)

OTHER PUBLICATIONS

International Search Report and Written Opinion dated May 7, 2019, for corresponding PCT Application No. PCT/JP2019/006541.

*Primary Examiner* — Dustin Q Dam
(74) *Attorney, Agent, or Firm* — Kinney & Lange, P.A.

(57) ABSTRACT

A thermoelectric power-generation device includes: a first flow path through which a high-temperature medium flows; a second flow path through which a low-temperature medium that has a temperature difference with respect to the high-temperature medium flows; an insulating isolation plate configured to isolate the first flow path from the second flow path; insulating outer layer isolation plates provided at outermost portions of layered flow paths including the first flow path and the second flow path; a plurality of thermoelectric conversion units configured to generate power using the temperature difference; and electrodes provided at the outer layer isolation plates and configured to connect the thermoelectric conversion units with mutually different semiconductor polarities in series, and the thermoelectric conversion units are disposed so as to straddle the first flow path and the second flow path.

7 Claims, 5 Drawing Sheets

(56) References Cited

U.S. PATENT DOCUMENTS

| | | | |
|---|---|---|---|
| 2003/0230332 A1* | 12/2003 | Venkatasubramanian | ................... H01L 35/08 136/205 |
| 2006/0180192 A1* | 8/2006 | Sharp | ...................... H01L 23/38 136/224 |
| 2011/0165440 A1 | 7/2011 | Uchimaya | |

FOREIGN PATENT DOCUMENTS

| JP | 2007-088039 A | 4/2007 |
|---|---|---|
| JP | 2009117645 A | 5/2009 |
| KR | 1020150084310 A | 7/2015 |
| KR | 1020160119465 A | 10/2016 |
| WO | 2007026432 A1 | 3/2007 |
| WO | 2009020100 A1 | 2/2009 |

* cited by examiner

THERMOELECTRIC POWER-GENERATION DEVICE

CROSS-REFERENCE TO RELATED APPLICATION(S)

This application is the national phase of PCT Application No. PCT/JP2019/006541 filed on Feb. 21, 2019, which in turn claims priority to Japanese Application No. 2018-04649 filed on Mar. 16, 2018, which are incorporated by reference herein in their entireties.

BACKGROUND

Technical Field

The present disclosure relates to a thermoelectric power-generation device using thermoelectric conversion elements.

Background Art

A thermoelectric conversion module is a module configured of thermoelectric conversion elements capable of converting a thermal energy into an electric energy using the Seebeck effect. Since it is possible to convert waste heat discharged from industrial and consumer use processes and mobile bodies into effective electric power by utilizing such energy conversion characteristics, the thermoelectric conversion module and the thermoelectric conversion elements configuring the module have attracted attention as energy saving technologies in consideration of environmental problems.

The thermoelectric conversion module as described above is configured of a plurality of thermoelectric conversion elements (P-type semiconductors and N-type semiconductors) joined with electrodes and is charged by providing a temperature difference between electrodes joined to both ends of each thermoelectric conversion element. Such a thermoelectric power-generation module can generate power using waste heat of exhaust gas from vehicle engines and other industrial devices, and for example, Patent Document 1 discloses an EGR gas power-generation device using EGR gas of a vehicle as a high-temperature heat source.

More specifically, according to the related art described in Patent Document 1, EGR flow paths for exhaust gas discharged from a vehicle engine and cooling water flow paths are alternately laminated, exhaust gas recirculation (EGR) is performed by cooling the exhaust gas, and power is generated by disposing a thermoelectric conversion module between the EGR flow paths and the cooling water flow paths.

PRIOR ART DOCUMENT

Patent Document

Patent Document 1: International Publication No. WO2007/026432

SUMMARY

However, according to the related art as described above, there is a concern that the overall thickness in a lamination direction increases and space saving is prevented due to addition of the thickness of the thermoelectric conversion module to the total thickness of the flow paths since the thermoelectric conversion module is disposed between the layered EGR flow paths and the cooling water flow paths. Also, according to the related art as described above, there is a concern that power generation efficiency is degraded due to a loss of heat conduction between the high-temperature and low-temperature media and the thermoelectric conversion module since ends of the thermoelectric conversion module are heated and cooled via upper plates and lower plates forming the flow paths and the electrodes.

The present disclosure is made in view of such circumstances, and an object of the present disclosure is to provide a space-saving thermoelectric power-generation device configured to curb degradation of power generation efficiency.

A thermoelectric power-generation device according to the present disclosure includes: a first flow path through which a first fluid flows; a second flow path through which a second fluid that has a temperature difference with respect to the first fluid flows; an insulating isolation plate configured to isolate the first flow path from the second flow path; insulating outer layer isolation plates provided at outermost portions of layered flow paths including the first flow path and the second flow path; a plurality of thermoelectric conversion units configured to generate power using the temperature difference; and electrodes provided at the outer layer isolation plates and configured to connect the thermoelectric conversion units with mutually different semiconductor polarities in series, and the thermoelectric conversion units are disposed so as to straddle the first flow path and the second flow path.

The thermoelectric power-generation device includes the plurality of thermoelectric conversion units connected in series by the electrodes in the layered flow paths including the first flow path through which the first fluid flows and the second flow path through which the second fluid flows, and the individual thermoelectric conversion units are disposed so as to straddle the first flow path and the second flow path. Therefore, since a loss of heat conduction is reduced by the thermoelectric conversion units coming direct contact with the first fluid and the second fluid, it is possible to efficiently convert the temperature difference between the first fluid and the second fluid into electric power and to curb degradation of power generation efficiency. Also, by the thermoelectric conversion units being disposed inside the layered flow paths including the first flow path and the second flow path isolated by the isolation plate, it is possible to reduce the overall thickness in a lamination direction as compared with the related art in which a thermoelectric conversion module is sandwiched by the flow paths. Thus, according to the first aspect of the present disclosure, it is possible to provide a space-saving thermoelectric power-generation device configured to curb degradation of power generation efficiency.

According to the present disclosure, it is possible to provide a space-saving thermoelectric power-generation device configured to curb degradation of power generation efficiency.

DETAILED DESCRIPTION

Hereinafter, embodiments of the present disclosure will be described in detail with reference to drawings. Also, the present disclosure is not limited to what will be described below and can be carried out in arbitrarily modified manner without changing the gist of the present disclosure. In addition, all the drawings used for describing the embodiments schematically illustrate configuration members, may be partially emphasized, enlarged, downsized, omitted, or the like for further understanding, and may not accurately illustrate scales, shapes, and the like of the configuration members. Hereinafter, the directions in a three-dimensional space in each drawing will be represented by reference signs X, Y, and Z for convenience of explanation.

First Embodiment

Figure 1:
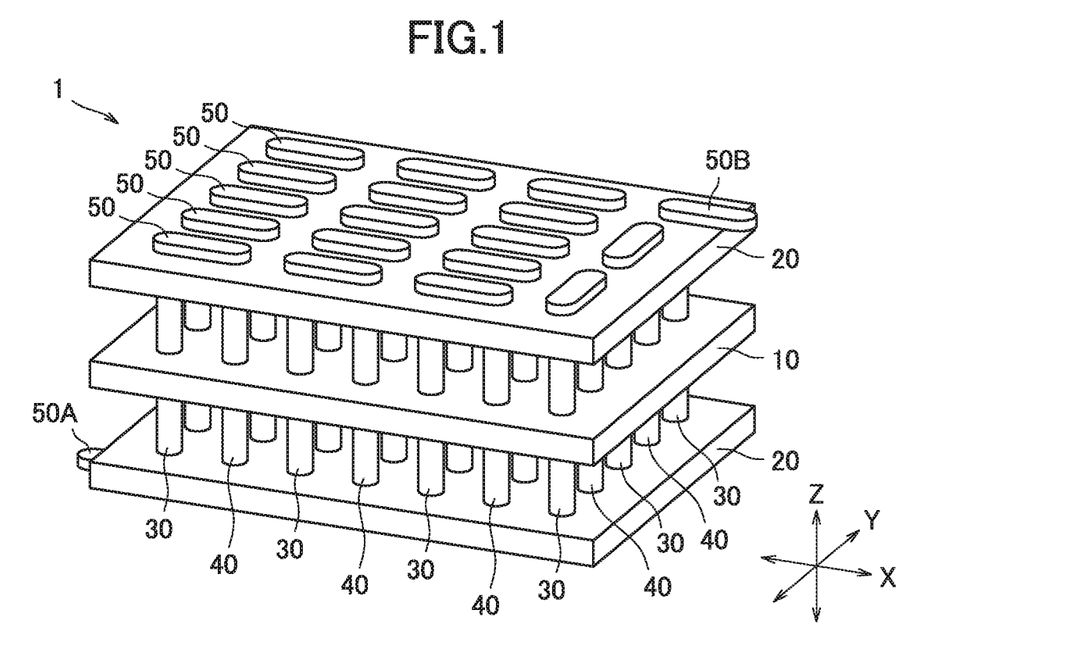
FIG. 1 is a perspective view illustrating main components of a thermoelectric power-generation device according to a first embodiment of the present disclosure.

A thermoelectric power-generation device 1 according to a first embodiment of the present disclosure will be described. FIG. 1 is a perspective view illustrating main components of the thermoelectric power-generation device 1 according to the first embodiment of the present disclosure. The thermoelectric power-generation device 1 includes an isolation plate 10, two outer layer isolation plates 20, a plurality of thermoelectric conversion units 30 and 40, and a plurality of electrodes 50. The thermoelectric power-generation device 1 causes electrodes 50A and 50B at terminals to generate electric power by a high-temperature medium H and a low-temperature medium C flowing through two flow paths formed by the isolation plate 10 and the two outer layer isolation plates 20 as will be described later in detail. Also, it is assumed that side walls (not illustrated in FIG. 1) are provided on both sides of the flow paths in the Y direction in order to form the two flow paths in the X direction in the embodiment.

The isolation plate 10 is a plate-shaped member that has insulating properties, isolates the high-temperature medium H from the low-temperature medium C, and is disposed in the XY plane in the embodiment. The isolation plate 10 is made of ceramic, for example, has thermal resistance and corrosion resistance with respect to the media, and has shielding properties that do not allow the media to be transmitted therethrough.

The two outer layer isolation plates 20 are made of a material that is similar to the material of the isolation plate 10 and are disposed at separate positions on both sides of the isolation plate 10 in the Z direction so as to be parallel to the isolation plate 10.

The plurality of thermoelectric conversion units 30 and 40 penetrate through the isolation plate 10 and are disposed such that both ends abut on the two outer layer isolation plates 20. The thermoelectric conversion units 30 include P-type semiconductor elements and generate electric power by holes therein moving due to a temperature difference between the high-temperature medium H and the low-temperature medium C, as will be described later in detail. Also, the thermoelectric conversion units 40 include N-type semiconductor elements and generate electric power by electrons therein moving due to a temperature difference between the high-temperature medium H and the low-temperature medium C, as will be described later in detail. The plurality of thermoelectric conversion units 30 and 40 are alternately disposed in a matrix shape in the X direction and the Y direction.

The plurality of electrodes 50 are made of a metal member such as copper, for example, are provided at the two outer layer isolation plates 20, and electrically connect ends of the alternately adjacent thermoelectric conversion units 30 and 40. In this manner, the electrodes 50 connect all the thermoelectric conversion units 30 and 40 in series. Also, the electrodes 50A and 50B at terminals of the series connection extend outward beyond the outer layer isolation plates 20 as extracting electrodes from which electric power is taken out.

Figure 2:
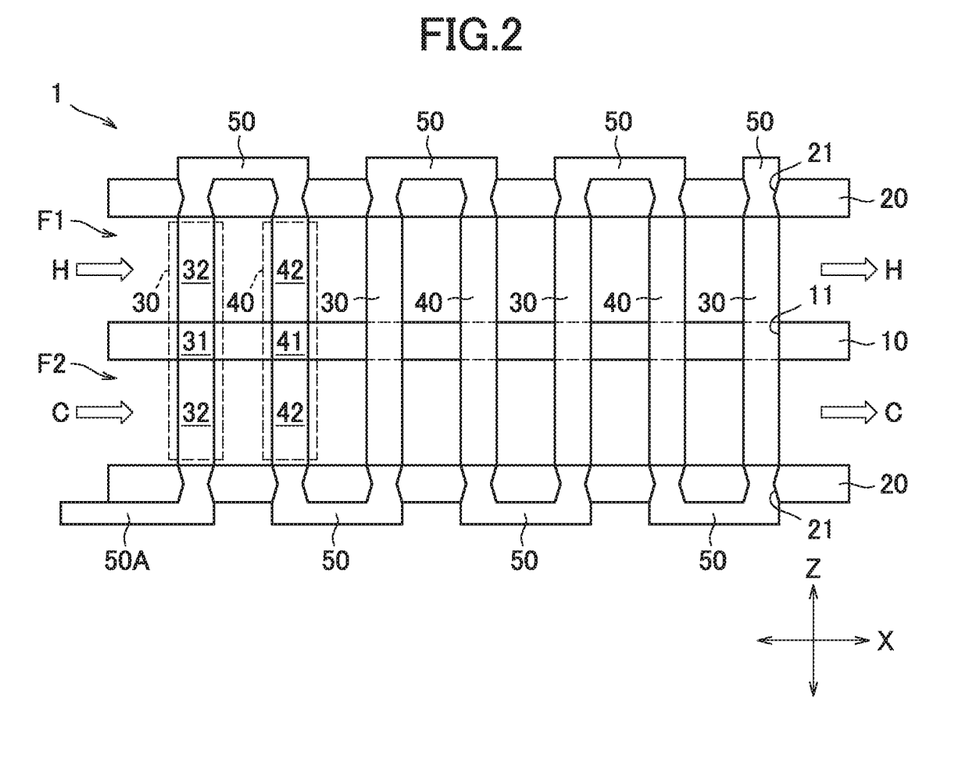
FIG. 2 is a sectional view of the thermoelectric power-generation device according to the first embodiment of the present disclosure.

FIG. 2 is a sectional view of the thermoelectric power-generation device 1 according to the first embodiment of the present disclosure. More specifically, FIG. 2 illustrates a section of the thermoelectric power-generation device 1 in FIG. 1 in the XZ plane passing through the electrode 50A at the terminal.

As illustrated in FIG. 2, a first flow path F1 is formed between the isolation plate 10 and one of the outer layer isolation plates 20, and the high-temperature medium H as the "first fluid" flows inside the first flow path F1. Also, a second flow path F2 is formed between the isolation plate 10 and the other outer layer isolation plates 20, and the low-temperature medium C as the "second fluid" flows inside the second flow path F2. In other words, the one first flow path F1 and the one second flow path F2 configure the layered flow paths, the isolation plate 10 isolates the first flow path F1 from the second flow path F2, and the outer layer isolation plates 20 are provided at outermost portions of the layered flow paths in the lamination direction (Z direction) in the embodiment.

Although the high-temperature medium H and the low-temperature medium C are assumed to flow in the same direction in the X direction as illustrated in FIG. 2 in the embodiment, the high-temperature medium H and the low-temperature medium C may flow in mutually opposite directions or may flow in mutually vertical directions in the XY plane. Although exhaust gas and cooling water are used as the high-temperature medium H and the low-temperature medium C in a case in which the thermoelectric power-generation device 1 is applied to exhaust gas recirculation (RGR) for a vehicle, for example, the high-temperature medium H and the low-temperature medium C are not necessarily limited thereto and may be any two fluids that have a temperature difference.

Each thermoelectric conversion unit 30 includes a conductive member 31 and two thermoelectric conversion elements 32. The conductive member 31 is made of metal that has electric conductivity such as copper, for example, and is provided so as to block through-holes 11 formed in the isolation plate 10. Both the two thermoelectric conversion elements 32 as the "first thermoelectric conversion element" and the "second thermoelectric conversion element" are formed of a known P-type semiconductor material, thus have mutually the same semiconductor polarity, and are disposed such that ends on one side are joined to the conductive member 31 via welding while ends on the other side abut on the outer layer isolation plates 20 in the first flow path F1 and the second flow path F2, respectively. In addition, both the conductive member 31 and the thermoelectric conversion elements 32 have the same sectional shape in the XY plane. Although the sectional shape is a circular shape in the embodiment, the sectional shape may be another shape.

Each thermoelectric conversion unit 40 includes a conductive member 41 and two thermoelectric conversion elements 42. The conductive member 41 is made of metal that has electric conductivity such as copper, for example, and is provided so as to block the through-holes 11 formed in the isolation plate 10. Both the two thermoelectric conversion elements 42 as the "first thermoelectric conversion element" and the "second thermoelectric conversion element" are formed of a known N-type semiconductor material, thus have mutually the same semiconductor polarity, and are disposed such that ends on one side are joined to the conductive member 41 via welding while ends on the other side abut on the outer layer isolation plates 20 in the first flow path F1 and the second flow path F2, respectively. In addition, both the conductive member 41 and the thermoelectric conversion elements 42 have the same sectional shape in the XY plane. Although the sectional shape is a circular shape in the embodiment, the sectional shape may be another shape.

The plurality of electrodes 50 are made of metal with electric conductivity such as copper, for example, and electrically connects adjacent thermoelectric conversion units 30 and thermoelectric conversion units 40 with mutually different semiconductor polarities while blocking through-holes 21 formed in the outer layer isolation plates 20. The electrodes 50 are secured to the outer layer isolation plates 20 via a swaging structure into the through-holes 21. Here, the through-holes 21 are formed to have nonlinear side surfaces in the thickness direction of the outer layer isolation plates 20, that is, the Z direction. Therefore, the electrodes 50 secured to the outer layer isolation plates 20 via the swaging structure have a structure with which the electrodes 50 are unlikely to be separated from the through-holes 21. Also, the electrodes 50 are joined directly to the thermoelectric conversion units 30 and the thermoelectric conversion units 40 via welding.

Also, the thermoelectric power-generation device 1 is adapted such that the high-temperature medium H heats the thermoelectric conversion elements 32 and 42 disposed in the first flow path F1, the low-temperature medium C cools the thermoelectric conversion elements 32 and 42 disposed in the second flow path F2, and the thermoelectric conversion units 30 and 40 thus generate electric power in mutually opposite directions with respect to the Z direction. In this manner, the thermoelectric power-generation device 1 can generate electric power using all the thermoelectric conversion units 30 and 40 connected in series.

As described above, the thermoelectric power-generation device 1 according to the first embodiment of the present disclosure is adapted such that the portion that comes into contact with the high-temperature medium H is directly heated while the portion that comes into contact with the low-temperature medium C is directly cooled since the individual thermoelectric conversion units 30 and thermoelectric conversion units 40 are disposed so as to straddle the first flow path F1 and the second flow path F2. Therefore, the thermoelectric power-generation device 1 can curb degradation of power generation efficiency (the amount of generated power with respect to the temperature difference between the media) since a loss of heat conduction between the thermoelectric conversion units 30 and 40 and the high-temperature and low-temperature media H and C is reduced. Also, the overall thickness of the thermoelectric power-generation device 1 in the lamination direction can be reduced as compared with the related art in which the thermoelectric conversion module is sandwiched between the flow paths since the thermoelectric conversion units 30 and the thermoelectric conversion units 40 are disposed inside the first flow path F1 and the second flow path F2. Thus, according to the first embodiment of the present disclosure, it is possible to provide a space-saving thermoelectric power-generation device that curbs degradation of power generation efficiency.

Also, the thermoelectric power-generation device 1 according to the first embodiment of the present disclosure is adapted such that the electrodes 50 that connect the thermoelectric conversion units 30 to the thermoelectric conversion units 40 are secured to the outer layer isolation plates 20 via the swaging structure. Therefore, it is possible to reduce a concern that the electrodes 50 are separated from the outer layer isolation plates 20 and to reduce a concern that the high-temperature medium H and the low-temperature medium C flow out of the through-holes 21 by blocking the through-holes 21 formed in the outer layer isolation plates 20.

Second Embodiment

Figure 3:
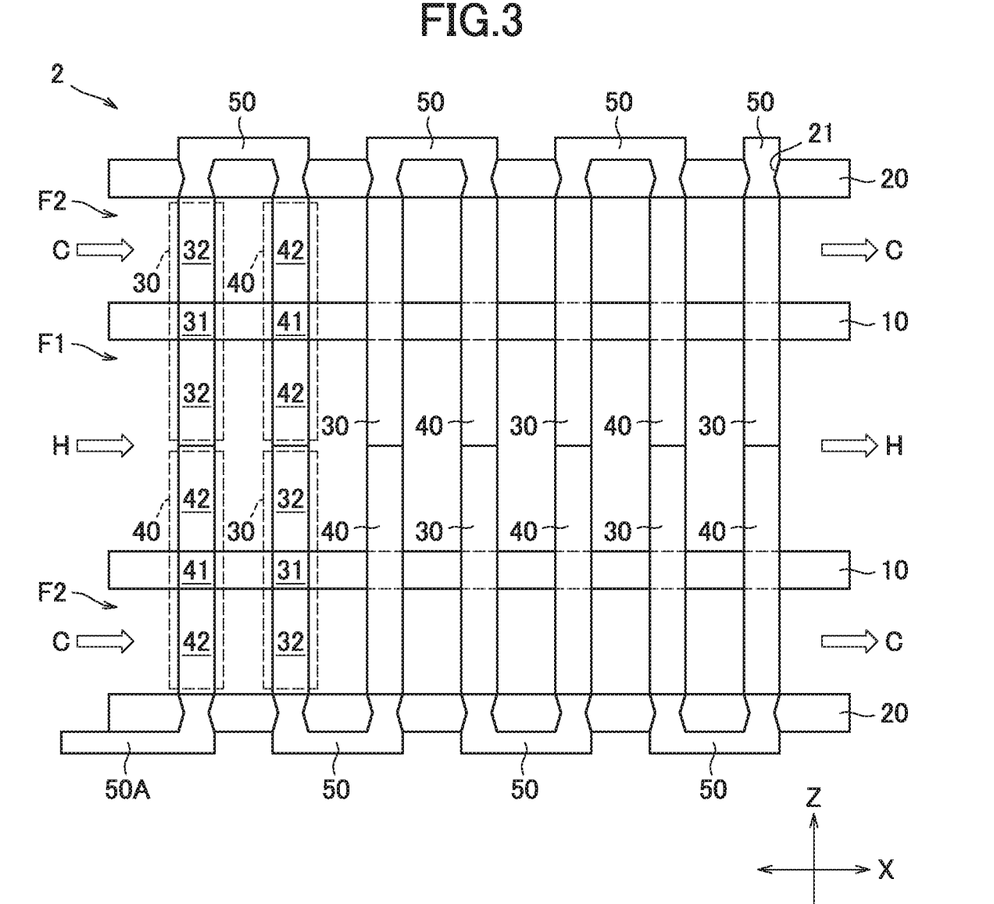
FIG. 3 is a sectional view of a thermoelectric power-generation device according to a second embodiment of the present disclosure.

A thermoelectric power-generation device 2 according to a second embodiment of the present disclosure will be described. The second embodiment of the present disclosure is different from the aforementioned first embodiment in that layered flow paths include one first flow path F1 and two second flow paths F2 and the thermoelectric conversion units 30 and the thermoelectric conversion units 40 are connected in the Z direction as well. Hereinafter, points that are different from those in the first embodiment will be described, and detailed description of points that are the same as those in the first embodiment will be omitted.

FIG. 3 is a sectional view of the thermoelectric power-generation device 2 according to the second embodiment of the present disclosure. More specifically, FIG. 3 illustrates a section of the thermoelectric power-generation device 2 in the XZ plane similarly to FIG. 2.

In the thermoelectric power-generation device 2, two isolation plates 10 and two outer layer isolation plates 20 are disposed in parallel to each other separately in the Z direction. As illustrated in FIG. 3, the first flow path F1 is formed between the two isolation plates 10, and the high-temperature medium H as the "first fluid" flows inside the first flow path F1. Also, second flow paths F2 are formed between the two isolation plates 10 and the two outer layer isolation plates 20, and the low-temperature medium C as the "second fluid" flows inside the second flow path F2. In other words, the layered flow paths are configured such that the one fist flow path F1 is sandwiched between the two second flow paths F2, the two isolation plates 10 isolate between the first flow path F1 and the second flow paths F2, and the outer layer isolation plates 20 are provided at outermost portions of the layered flow paths in the lamination direction (Z direction).

The plurality of thermoelectric conversion units 30 and thermoelectric conversion units 40 are alternately disposed in the X direction and the Y direction and are also disposed one by one in the Z direction as well. At this time, the thermoelectric conversion units 30 and the thermoelectric conversion units 40 aligned in the Z direction are joined directly to each other via welding in the first flow path F1. Also, the thermoelectric conversion units 30 and the thermoelectric conversion units 40 joined to each other in the Z direction generate electric power in the same direction in the drawing and are electrically connected in series since the thermoelectric conversion units 30 and the thermoelectric conversion units 40 have mutually different semiconductor polarities.

As described above, the thermoelectric power-generation device 2 according to the second embodiment of the present disclosure is adapted such that the first flow path F1 and the second flow paths F2 are alternately disposed and the thermoelectric conversion units 30 and the thermoelectric conversion units 40 are joined to each other in the lamination direction. Thus, according to the thermoelectric power-generation device 2 in the second embodiment of the present disclosure, it is possible to reduce the number of outer layer isolation plates 20 to which the electrodes 50 are swaged and secured and to save the space in the lamination direction as compared with a case in which two thermoelectric power-generation devices 1 as describe above are disposed in the lamination direction. In addition, it is also possible to expand the series connection in the lamination direction by alternately joining the thermoelectric conversion units 30 and the thermoelectric conversion units 40 in the lamination direction even in a case in which more first flow paths F1 and second flow paths F2 are alternately disposed with a similar configuration.

Third Embodiment

Figure 4:
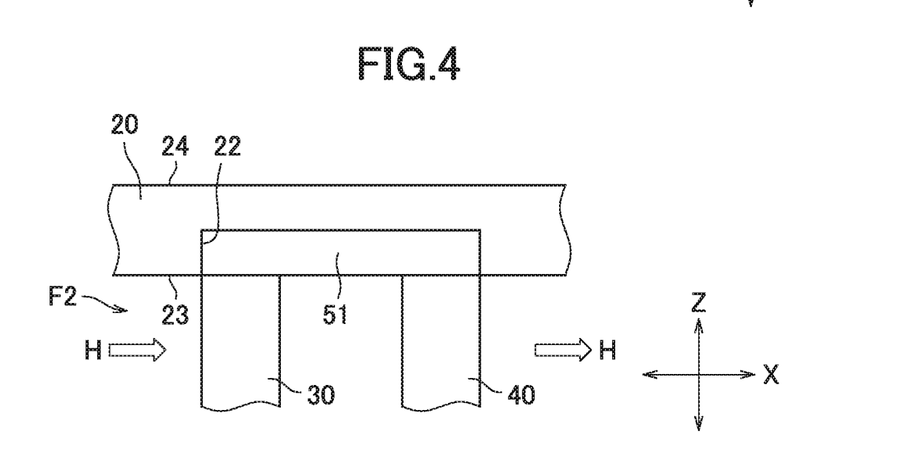
FIG. 4 is a sectional view of an electrode according to a third embodiment of the present disclosure.

A third embodiment of the present disclosure will be described. A configuration of electrodes 51 provided at the outer layer isolation plates 20 according to the third embodiment of the present disclosure is different from the aforementioned configuration of the electrodes 50 in the first embodiment. Hereinafter, points that are different from those in the first embodiment will be described, and detailed description of points that are the same as those in the first embodiment will be omitted.

FIG. 4 is a sectional view of the electrode 51 according to the third embodiment of the present disclosure. More specifically, FIG. 4 illustrates a section of one of the electrodes 51 swaged and secured to the outer layer isolation plate 20 in the XZ plane. Although the electrodes 51 provided at the outer layer isolation plate 20 that comes into contact with the first flow path F1 will be described here, description of the electrodes 51 provided at the outer layer isolation plate 20 that comes into contact with the second flow path F2 will be omitted since such electrodes 51 also have a similar configuration.

As illustrated in FIG. 4, a recessed portion 22 for accommodating the electrode 51 that connects the thermoelectric conversion unit 30 to the thermoelectric conversion unit 40 is formed in the outer layer isolation plate 20. The recessed portion 22 is formed to face an inner surface 23 of the outer layer isolation plate 20, and the electrode 51 is swaged and secured to the inside thereof. Therefore, it is possible to dispose the electrode 51 so as not to project to the outside of the layered flow paths beyond the outer surface 24 of the outer layer isolation plate 20.

Thus, according to the third embodiment of the present disclosure, it is possible to obtain the configuration in which the electrodes 51 do not project from the outer layer isolation plates 20 in the lamination direction and to reduce the overall thickness in the lamination direction as compared with the aforementioned first embodiment.

Fourth Embodiment

Figure 5:
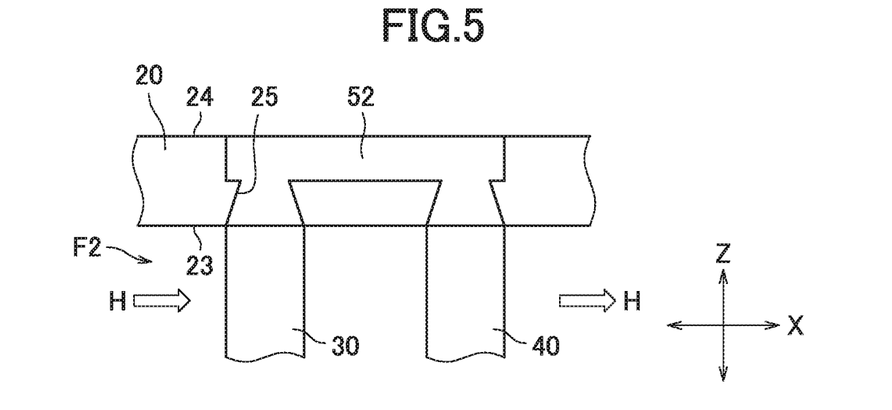
FIG. 5 is a sectional view of an electrode according to a fourth embodiment of the present disclosure.

A fourth embodiment of the present disclosure will be described. A configuration of electrodes 52 provided at the outer layer isolation plates 20 according to the fourth embodiment of the present disclosure is different from the aforementioned configuration of the electrodes 50 according to the first embodiment. Hereinafter, points that are different from those in the first embodiment will be described, and detailed description of points that are the same as those in the first embodiment will be omitted.

FIG. 5 is a sectional view of the electrode 52 according to the fourth embodiment of the present disclosure. More specifically, FIG. 5 illustrates a section of one of the electrodes 52 swaged and secured to the outer layer isolation plate 20 in the XZ plane. Although the electrodes 52 provided at the outer layer isolation plate 20 that comes into contact with the first flow path F1 will be described here, description of the electrodes 52 provided at the outer layer isolation plate 20 that comes into contact with the second flow path F2 will be omitted since such electrodes 52 can also have a similar configuration.

As illustrated in FIG. 5, a partial through-hole 25 for accommodating the electrode 52 that connects the thermoelectric conversion unit 30 to the thermoelectric conversion unit 40 is formed in the outer layer isolation plate 20. The partial through-hole 25 is formed so as to couple a penetrating portion of the outer layer isolation plate 20 to a recessed portion formed so as to face an outer surface 24 of the outer layer isolation plate 20, and the electrode 52 is swaged and secured to the inside thereof. Therefore, it is possible to dispose the electrode 52 so as not to project to the outside of the layered flow paths beyond the outer surface 24 of the outer layer isolation plate 20.

Thus, according to the fourth embodiment of the present disclosure, it is possible to obtain the configuration in which the electrodes 52 do not project from the outer layer isolation plates 20 in the lamination direction and to reduce the overall thickness in the lamination direction as compared with the aforementioned first embodiment. In addition, according to the fourth embodiment of the present disclosure, it is possible to obtain the configuration in which the electrodes 52 are unlikely to be separated in both the directions of the inner surface 23 and the outer surface 24 of the outer layer isolation plates 20.

Fifth Embodiment

Figure 6:
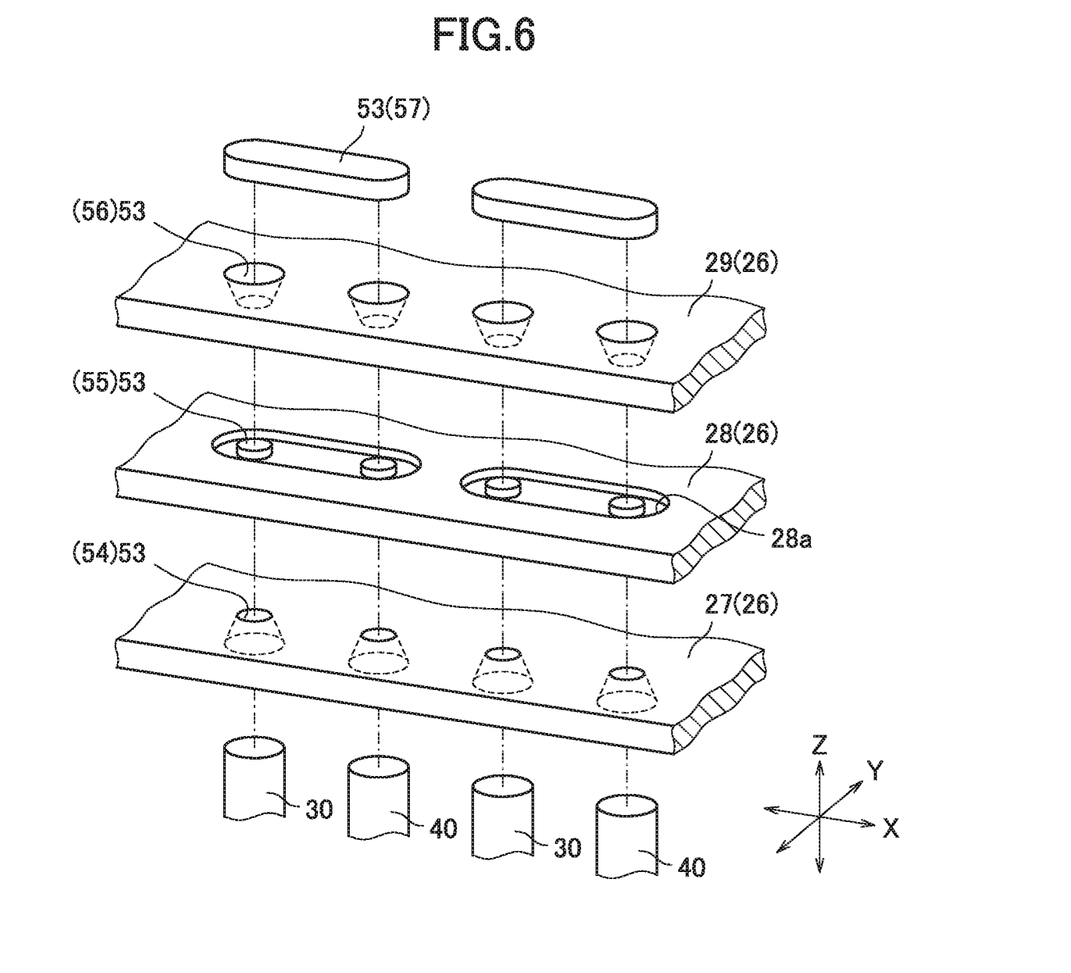
FIG. 6 is an exploded perspective view illustrating a part of an outer layer isolation plate according to a fifth embodiment of the present disclosure.
Figure 7:
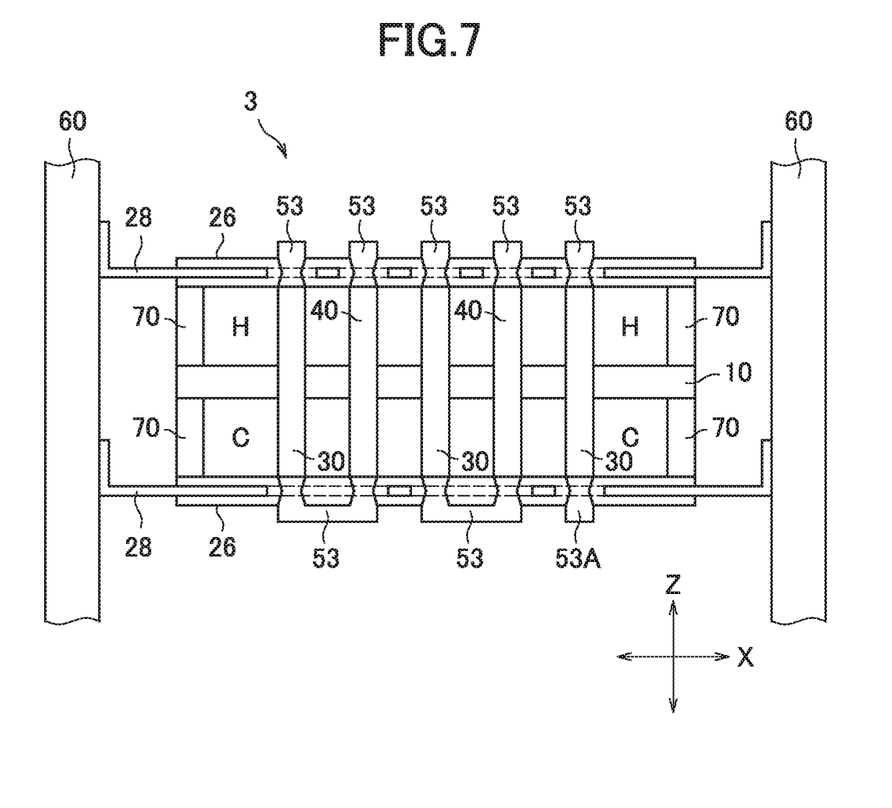
FIG. 7 is a sectional view of a thermoelectric power-generation device according to the fifth embodiment of the present disclosure.

A fifth embodiment of the present disclosure will be described. A configuration of outer layer isolation plates 26 and a configuration of electrodes 53 provided at the outer layer isolation plates 26 according to the fifth embodiment of the present disclosure are different from that of the outer layer isolation plates 20 and that of the electrodes 50 provided at the outer layer isolation plates 20 according to the aforementioned first embodiment. Hereinafter, points that are different from those in the first embodiment will be described, and detailed description of points that are the same as those in the first embodiment will be omitted.

FIG. 6 is an exploded perspective view illustrating a part of the outer layer isolation plates 26 according to the fifth embodiment of the present disclosure. The outer layer isolation plates 26 include a first outer layer isolation plate 27 and a second outer layer isolation plate 29 made of a material that is similar to that of the aforementioned outer layer isolation plates 20 and include a metal plate 28, and the first outer layer isolation plate 27 and the second outer layer isolation plate 29 are attached to both surfaces of the metal plate 28. Here, since the first outer layer isolation plate 27 and the second outer layer isolation plate 29 are reinforced by the attached metal plate 28, the outer layer isolation plates 26 can be formed to be thinner than the aforementioned outer layer isolation plates 20.

Each of the electrodes 53 swaged and secured to the outer layer isolation plates 26 is configured to have a shape including a first portion electrode 54, a second portion electrode 55, a third portion electrode 56, and a fourth portion electrode 57 in accordance with the layered structure of the outer layer isolation plates 26. The first portion electrode 54 is disposed in the same layer as the first outer layer isolation plate 27 so as to block a through-hole formed in the first outer layer isolation plate 27. The second portion electrode 55 is disposed in the same layer as the first outer layer isolation plate 27 with a clearance provided with respect to a hole portion 28a formed in the metal plate 28. The third portion electrode 56 is disposed in the same layer as the second outer layer isolation plate 29 so as to block a through-hole formed in the second outer layer isolation plate 29. In addition, the fourth portion electrode 57 electrically connects two adjacent third portion electrodes 56 on the outer surface of the second outer layer isolation plate 29.

Although the first portion electrode 54 to the fourth portion electrode 57 are described separately here, all of the first portion electrode 54 to the fourth portion electrode 57 are made of the same material and are integrally formed as the electrode 53. Also, since the first outer layer isolation plate 27 and the second outer layer isolation plate 29 are formed of an insulating material while the metal plate 28 has conductivity, a configuration in electrical continuity with the thermoelectric conversion units 30 and the thermoelectric conversion units 40 is not established via the electrodes 53 is obtained by providing a plurality of hole portions 28a.

FIG. 7 is a sectional view of a thermoelectric power-generation device 3 according to the fifth embodiment of the present disclosure. More specifically, FIG. 7 illustrates a section of the thermoelectric power-generation device 3 in a case in which the first outer layer isolation plate 27 and the second outer layer isolation plate 29 include the metal plate 28 in the YZ plane passing through an electrode 53A at the terminal. In other words, FIG. 7 illustrates a section when seen from the upstream side of the high-temperature medium H an the low-temperature medium C.

The thermoelectric power-generation device 3 is provided with side walls 70 that prevent the high-temperature medium H and the low-temperature medium C flowing in the X direction from flowing out in the Y direction. The side walls 70 may be made of a material that is similar to the material of the isolation plate 10 and the outer layer isolation plates 26 and may be formed integrally with the isolation plate 10 and the outer layer isolation plates 26.

The outer layer isolation plates 26 are formed to include the aforementioned metal plate 28. The metal plate 28 is formed to be longer than the outer layer isolation plate 26 in the Y direction in the embodiment. Also, the metal plate 28 can be used as a securing member for easily securing the thermoelectric power-generation device 3 to a mounting location. In a case in which the thermoelectric power-generation device 3 includes a metal case body 60 as illustrated in FIG. 7, for example, it is possible to connect the metal plate 28 to an inner wall surfaces of the case body 60 via welding. Here, since the outer layer isolation plates 26 are formed of ceramic, for example, it is possible to more strongly secure the thermoelectric power-generation device 3 by establishing the connection via the metal plate 28 than by connecting the thermoelectric power-generation device 3 directly to the case body 60. Also, since the metal plate 28 comes into contact with neither the high-temperature medium H nor the low-temperature medium C, it is possible to prevent corrosion due to the high-temperature medium H or the low-temperature medium C.

Sixth Embodiment

Figure 8:
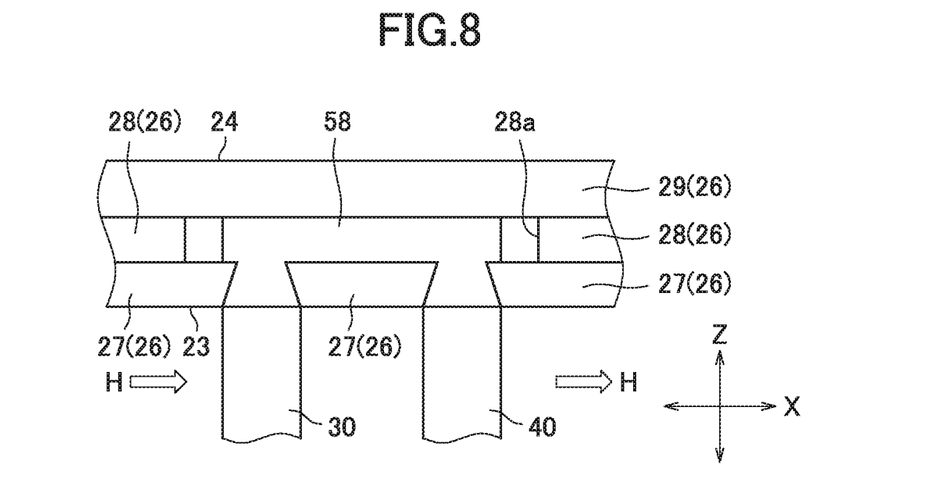
FIG. 8 is a sectional view of an electrode according to a sixth embodiment of the present disclosure.

A sixth embodiment of the present disclosure will be described. A configuration of electrodes 58 according to the sixth embodiment of the present disclosure is different from the configuration of the electrodes 53 according to the aforementioned fifth embodiment. Hereinafter, points that are different from those in the fifth embodiment will be described, and detailed description of points that are the same as those in the fifth embodiment will be omitted.

FIG. 8 is a sectional view of the electrode 58 according to the sixth embodiment of the present disclosure. More specifically, FIG. 8 illustrates a section of one of the electrodes 58 swaged and secured to the outer layer isolation plate 26 in the XZ plane. Although the electrodes 58 provided at the outer layer isolation plate 26 that comes into contact with the first flow path F1 will be described here, description of the electrodes 58 provided at the outer layer isolation plate 26 that comes into contact with the second flow path F2 will be omitted since such electrodes 58 can have a similar configuration.

Each of the electrodes 58 according to the embodiment is configured of two penetrating portions that penetrate through the first outer layer isolation plate 27 and that are connected to each of the thermoelectric conversion unit 30 and the thermoelectric conversion unit 40 and a connecting portion that connects the two penetrating portions in the same layer as the first outer layer isolation plate 27. In other words, it is possible to reduce a concern that the electrodes 58 experience influences such as corrosion due to the media in a case in which the electrodes 58 do not come into contact with the high-temperature medium H and also even in a case in which the electrodes 58 on the side of the outer surface 24 of the outer layer isolation plate 26 are exposed to another medium.

Seventh Embodiment

Figure 9:
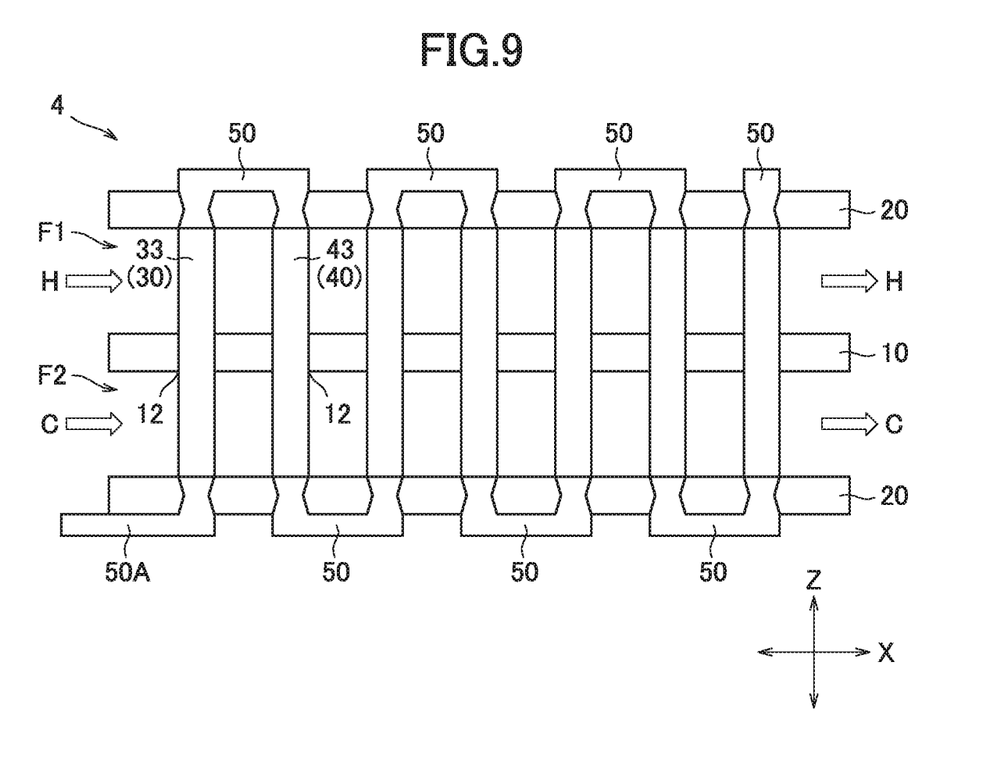
FIG. 9 is a sectional view of a thermoelectric power-generation device according to a seventh embodiment of the present disclosure.

A seventh embodiment of the present disclosure will be described. The seventh embodiment of the present disclosure is different from the aforementioned first embodiment in configurations of the thermoelectric conversion units 30 and the thermoelectric conversion units 40. Hereinafter, points that are different from those in the first embodiment will be described, and detailed description of points that are the same as those in the first embodiment will be omitted.

FIG. 9 is a sectional view of a thermoelectric power generation device 4 according to the seventh embodiment of the present disclosure. More specifically, FIG. 9 illustrates a section in the XZ plane passing through an electrode 50A at the terminal.

The thermoelectric conversion units 30 according to the embodiment are configured of P-type semiconductor elements 33 that penetrate through the isolation plate 10 between the two outer layer isolation plates 20. Also, the thermoelectric conversion units 40 according to the embodiment are configured of N-type semiconductor elements 43 that penetrate through the isolation plate 10 between the two outer layer isolation plates 20. Here, in a case in which there is a concern that a clearance is generated between the thermoelectric conversion units 30 and 40 and the through-holes formed in the isolation plate 10, it is possible to secure sealing properties by blocking the clearance with a plating member 12, for example. Thus, according to the thermoelectric conversion units 30 and the thermoelectric conversion units 40 of the embodiment, it is possible to obtain effects and advantages that are similar to those in the aforementioned first embodiment even with the configuration in which the individual semiconductor elements penetrate through the isolation plate 10.

Although the description of the embodiments ends here, the present disclosure is not limited to the aforementioned embodiments. For example, the disposition of the first flow path F1 and the second flow path F2 may be opposite to configure the layered flow paths in each of the aforementioned embodiments. Also, although the aspect in which the first flow path F1 and the second flow path F2 are laminated in the Z direction to configure the layered flow paths has been exemplified in each of the aforementioned embodiments, the first flow path F1 and the second flow path F2 may be laminated in a radial direction of concentric circles to configure layered flow paths.

Also, in the aforementioned first embodiment and the second embodiment, the conductive members 31 and 41 illustrated in FIGS. 2 and 3 may be secured to the through-holes 11 in the isolation plate 10 via a swaging structure similarly to the electrodes 50. Further, the isolation plate 10 may be provided with the metal plate 28 similarly to the outer layer isolation plates 26 illustrated in FIGS. 6 and 7.

Also, although the first flow path F1 and the second flow path F2 illustrated in FIGS. 2 and 3 are isolated with a single isolation plate 10 in each of the aforementioned embodiments, the isolation plate 10 may have double structures. At this time, the overall thickness of the isolation plate 10 with the double structures is suitably set to a thickness that is substantially the same as the thickness of the isolation plate 10 in each of the aforementioned embodiments. In this manner, the isolation plate 10 with the double structures can reliably prevent the high-temperature medium H and the low-temperature medium C from being mixed due to leakage without leading an increase in overall thickness in the lamination direction. Also, although the through-holes 11 are formed in each of the isolation plate 10 with the double structures in this case, it is possible to apply conductive members 31 and 41 with substantially the same dimensions as those in each of the aforementioned embodiments to the conductive members 31 and 41 provided at the through-holes 11.

In addition, the widths of the thermoelectric conversion units 30 and the thermoelectric conversion units 40 may differently be set by providing a difference between the sectional area of the thermoelectric conversion units 30 and the sectional area of the thermoelectric conversion units 40 in each of the aforementioned embodiments. In a case in which elements of a type of either one of the thermoelectric conversion elements 32 configured of the P-type semiconductor material or the thermoelectric conversion elements 42 configured of the N-type semiconductor material have higher resistance values than resistance values of elements of the other type, for example, it is suitable to set the sectional area of the elements of the one type to be larger than the sectional area of the elements of the other type in accordance with the difference in the resistance values. In this manner, it is possible to balance electric conductivity between the thermoelectric conversion units 30 and the thermoelectric conversion units 40 that are connected in series.

Embodiments of Present Disclosure

According to a first aspect of the present disclosure, there is provide a thermoelectric power-generation device including: a first flow path through which a first fluid flows; a second flow path through which a second fluid that has a temperature difference with respect to the first fluid flows; an insulating isolation plate configured to isolate the first flow path from the second flow path; insulating outer layer isolation plates provided at outermost portions of layered flow paths including the first flow path and the second flow path; a plurality of thermoelectric conversion units configured to generate power using the temperature difference; and electrodes provided at the outer layer isolation plates and configured to connect the thermoelectric conversion units with mutually different semiconductor polarities in series, in which the thermoelectric conversion units are disposed so as to straddle the first flow path and the second flow path.

The thermoelectric power-generation device includes the plurality of thermoelectric conversion units connected in series by the electrode in the layered flow paths including the first flow path through which the first fluid flows and the second flow path through which the second fluid flows, and the individual thermoelectric conversion units are disposed so as to straddle the first flow path and the second flow path. Therefore, since a loss of heat conduction is reduced by the thermoelectric conversion units coming into direct contact with the first fluid and the second fluid, it is possible to efficiently convert the temperature difference between the first fluid and the second fluid and to curb degradation of power generation efficiency. Also, the thermoelectric conversion units are disposed inside the layered flow paths including the first flow path and the second flow path isolated by the isolation plate, and it is thus possible to reduce the overall thickness in a lamination direction as compared with the related art in which the thermoelectric conversion module is sandwiched between the flow paths. Thus, according to the first aspect of the present disclosure, it is possible to provide a space-saving thermoelectric power-generation device configured to curb degradation of power generation efficiency.

A second aspect of the present disclosure provides the thermoelectric conversion device in which the first flow path is disposed so as to be sandwiched by a plurality of second flow paths, and the plurality of thermoelectric conversion units are adapted such that the thermoelectric conversion units with mutually different semiconductor polarities are joined to each other at the first flow path, in the aforementioned first aspect of the present disclosure.

According to the second aspect of the present disclosure, the two isolation plates face one another via the first flow path by the layered flow paths in which the one first flow path is sandwiched between the two second flow paths being formed. Also, since the thermoelectric conversion units are disposed so as to penetrate through the isolation plates, the thermoelectric conversion units are aligned in the lamination direction of the layered flow paths. Here, these thermoelectric conversion units have mutually different semiconductor polarities and are joined to each other. Thus, according to the second aspect of the present disclosure, it is possible to directly connect the plurality of thermoelectric conversion units that are connected in series in the lamination direction and to provide a thermoelectric power-generation device that saves the space in the lamination direction.

A third aspect of the present disclosure provides the thermoelectric power-generation device in which the electrodes are secured to the outer layer isolation plates with a swaging structure, in the aforementioned first or second aspect of the present disclosure.

According to the third aspect of the present disclosure, it is possible to reduce a concern that the electrodes are separated from the outer layer isolation plates since the electrodes are swaged and secured to the outer layer isolation plates. Also, according to the third aspect of the present disclosure, it is possible to prevent the first fluid or the second fluid from leaking from through-holes even in a case in which the electrodes are provided at the through-holes formed in the outer layer isolation plates, by the electrodes being swaged and secured so as to block the through-holes.

A fourth aspect of the present disclosure provides the thermoelectric power-generation device in which the electrodes are disposed so as not to project outward beyond an outer surface of the outer layer isolation plates, in any one of the aforementioned first to third aspects of the present disclosure.

The electrodes provided at the outer layer isolation plates are disposed inside the outer layer isolation plates or on the side of the flow path beyond the outer layer isolation plates. Thus, according to the fourth aspect of the present disclosure, the thickness of the thermoelectric power-generation device in the lamination direction of the layered flow paths is curbed to the width defined by the two outer layer isolation plates, and it is possible to further save the space.

A fifth aspect of the present disclosure is the thermoelectric power-generation device in which the electrodes are not in contact with the first fluid and the second fluid, in any one of the aforementioned first to fourth aspects of the present disclosure.

According to the fifth aspect of the present disclosure, it is possible to reduce a concern that the electrodes are damaged even in a case in which the first fluid or the second fluid is metal corrosive or the temperature of the first fluid or the second fluid is high, by the electrodes being formed at positions at which the electrodes do not come into contact with the first fluid and the second fluid.

A sixth aspect of the present disclosure is the thermoelectric power-generation device in which at least one of the outer layer isolation plates and the isolation plate includes a metal plate, and the metal plate does not have electrical continuity with the thermoelectric conversion units, in any one of the aforementioned first to fifth aspects of the present disclosure.

The thermoelectric power-generation device can easily be secured to a mounting location via the metal plate by at least one of the outer layer isolation plates and the isolation plate including the metal plate that is electrically insulated from the thermoelectric conversion units. Here, the outer layer isolation plates and the isolation plate are preferably formed of a material that is unlikely to be damaged even if the material comes into contact with the first fluid and the second fluid, and there may be a concern that strength of the outer layer isolation plates and the isolation plate as a member for securing the thermoelectric power-generation device directly to the mounting location becomes insufficient depending on conditions. Thus, according to the sixth aspect of the present disclosure, it is possible to establish stronger connection than direct connection by at least one of the outer layer isolation plates and the isolation plate securing the thermoelectric power-generation device via the metal plate, for example.

A seventh aspect of the present disclosure is the thermoelectric power-generation device in which the metal plate is disposed so as not to be in contact with the first fluid and the second fluid, in the aforementioned sixth aspect of the present disclosure.

According to the seventh aspect of the present disclosure, it is possible to reduce a concern that the metal plate is damaged even in a case in which the first fluid or the second fluid is metal corrosive or the temperature of the first fluid or the second fluid is high, by the metal plate being formed at a position at which the metal plate does not come into contact with the first fluid and the second fluid.

An eighth aspect of the present disclosure is the thermoelectric power-generation device in which the thermoelectric conversion units include a conductive member configured to block through-holes formed in the isolation plate, a first thermoelectric conversion element disposed at the first flow path and connected to the conductive member, and a second thermoelectric conversion element disposed at the second flow path and connected to the conductive member, and the first thermoelectric conversion element and the second thermoelectric conversion element have a mutually same semiconductor polarity, in any one of the aforementioned first to seventh aspects of the present disclosure.

The thermoelectric conversion units are formed such that the first thermoelectric conversion element and the second thermoelectric conversion element with mutually the same semiconductor polarity sandwich the conductive member, and are disposed so as to straddle the first flow path and the second flow path. Here, the conductive member is swaged and secured to the isolation plate so as to block the through-holes formed in the isolation plate, and the electrodes are provided at the outer layer isolation plates as described above. In this manner, the thermoelectric power-generation device can be formed in a single joining by disposing and welding the first thermoelectric conversion element and the second thermoelectric conversion element between the isolation plate provided with the conductive member and the plurality of outer layer isolation plates provided with the electrodes. Thus, according to the eighth aspect of the present disclosure, it is possible to provide a thermoelectric power-generation device with a structure that enables improvement in manufacturing efficiency regardless of the structure in which the layered flow paths and the thermoelectric conversion units are integrated.

EXPLANATION OF REFERENCE SIGNS

1 Thermoelectric power-generation device
10 Isolation plate
11, 21 Through-hole
20 Outer layer isolation plate
23 Inner surface
24 Outer surface
28 Metal plate
28a Hole portion
30, 40 Thermoelectric conversion unit
31, 41 Conductive member
32, 42 Thermoelectric conversion element
50 Electrode
H High-temperature medium
C Low-temperature medium
F1 First flow path
F2 Second flow path

The invention claimed is:

1. A thermoelectric power-generation device comprising:
a first flow path through which a first fluid flows;
a second flow path through which a second fluid that has a temperature difference with respect to the first fluid flows;
an insulating isolation plate configured to isolate the first flow path from the second flow path;
insulating outer layer isolation plates provided at outermost portions of layered flow paths including the first flow path and the second flow path;
a plurality of thermoelectric conversion units configured to generate power using the temperature difference; and
electrodes provided at the outer layer isolation plates and configured to connect the plurality of thermoelectric conversion units with mutually different semiconductor polarities in series,
wherein the plurality of thermoelectric conversion units are disposed so as to straddle the first flow path and the second flow path;
wherein the plurality of thermoelectric conversion units include conductive members that are made of metal and are configured to extend into and block through-holes formed in the isolation plate, first thermoelectric conversion elements disposed at the first flow path and connected to the conductive members, and second thermoelectric conversion elements disposed at the second flow path, the first and second thermoelectric conversion elements being connected to the conductive members and having same sectional sizes and shapes as the conductive members; and
wherein the first thermoelectric conversion elements and the second thermoelectric conversion elements have a mutually same semiconductor polarity.

2. The thermoelectric power-generation device according to claim 1,
wherein the first flow path is disposed so as to be sandwiched by a plurality of the second flow paths, and
the plurality of thermoelectric conversion units are adapted such that thermoelectric conversion units with mutually different semiconductor polarities, among the plurality of thermoelectric conversion units, are joined to each other at the first flow path.

3. The thermoelectric power-generation device according to claim 1, wherein the electrodes are secured to the outer layer isolation plates with a swaging structure.

4. The thermoelectric power-generation device according to claim 1, wherein the electrodes are disposed so as not to project outward beyond an outer surface of the outer layer isolation plates.

5. The thermoelectric power-generation device according to claim 1, wherein the electrodes are not in contact with the first fluid or the second fluid.

6. The thermoelectric power-generation device according to claim 1,
wherein at least one of the outer layer isolation plates and/or the isolation plate includes a metal plate that does not have electrical continuity with the plurality of thermoelectric conversion units.

7. The thermoelectric power-generation device according to claim 6, wherein each metal plate is disposed so as not to be in contact with the first fluid or the second fluid.

* * * * *